United States Patent
Shimada et al.

(10) Patent No.: US 8,460,787 B2
(45) Date of Patent: Jun. 11, 2013

(54) SEALING FILM FOR SOLAR CELL

(75) Inventors: Makiko Shimada, Kanagawa (JP);
Tokuo Okada, Kanagawa (JP);
Hisataka Kataoka, Kanagawa (JP);
Yoshihiko Inoue, Kanagawa (JP)

(73) Assignee: Bridgestone Corporation, Tokyo (JP)

( * ) Notice: Subject to any disclaimer, the term of this patent is extended or adjusted under 35 U.S.C. 154(b) by 676 days.

(21) Appl. No.: 12/513,430

(22) PCT Filed: Nov. 8, 2007

(86) PCT No.: PCT/JP2007/071692
§ 371 (c)(1),
(2), (4) Date: May 4, 2009

(87) PCT Pub. No.: WO2008/056730
PCT Pub. Date: May 15, 2008

(65) Prior Publication Data
US 2010/0288347 A1   Nov. 18, 2010

(30) Foreign Application Priority Data

Nov. 8, 2006  (JP) .................................. 2006-302427
Nov. 8, 2006  (JP) .................................. 2006-302433

(51) Int. Cl.
B32B 5/16 (2006.01)
(52) U.S. Cl.
USPC ............................ 428/330; 428/323; 428/402
(58) Field of Classification Search
USPC ........................................ 428/323, 330, 402
See application file for complete search history.

(56) References Cited

U.S. PATENT DOCUMENTS
2006/0052558 A1 *  3/2006  Morikawa et al. ............. 526/247

FOREIGN PATENT DOCUMENTS
| | | |
|---|---|---|
| EP | 1164167 A1 | 12/2001 |
| EP | 1783159 A1 | 5/2007 |
| EP | 2003701 A1 | 12/2008 |
| JP | 7-78507 A | 3/1995 |
| JP | 07-302925 A | 11/1995 |
| JP | 09027633 A * | 1/1997 |
| JP | 10-256580 A | 9/1998 |
| JP | 2000-174296 A | 6/2000 |
| JP | 2000-183381 A | 6/2000 |
| JP | 3323560 B2 * | 9/2002 |
| JP | 2003-261719 A | 9/2003 |
| JP | 2005-29588 A | 2/2005 |
| JP | 2005-183829 A | 7/2005 |
| WO | 2007/021151 A1 | 2/2007 |

OTHER PUBLICATIONS
Segawa, M. et al., Sealing Film for Solar Use and Solar Cell Module, Jan. 28, 1997, machine translation of JP09-027633A.*

* cited by examiner

*Primary Examiner* — Hai Vo
*Assistant Examiner* — Chinessa Adkins
(74) *Attorney, Agent, or Firm* — Sughrue Mion, PLLC

(57) ABSTRACT

Sealing film for solar cell which prevents conducting wires and electrodes of the solar cell from rusting and thereby enable the solar cell to retain its high photovoltaic performance for a long period. A light receiving surface sealing film for solar cell comprising ethylene-vinyl acetate copolymer, a cross-linking agent and an acid acceptor. A rear surface sealing film for solar cell comprising ethylene-vinyl acetate copolymer, a cross-linking agent and an acid acceptor, wherein the acid acceptor is contained in the range of not less than 0.5 parts by weight based on 100 parts by weight of ethylene-vinyl acetate copolymer.

3 Claims, 1 Drawing Sheet

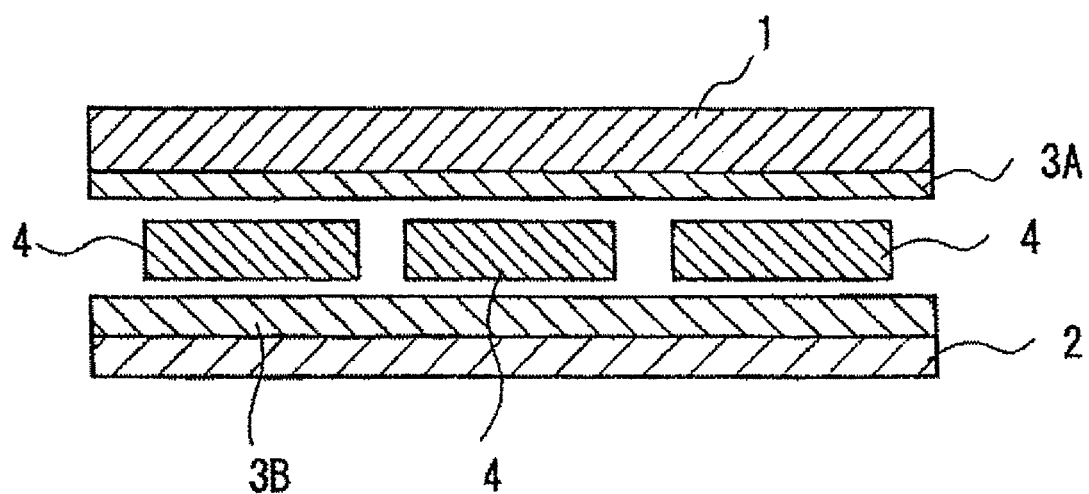

SEALING FILM FOR SOLAR CELL

BACKGROUND OF INVENTION

1. Field of the Invention

The present invention relates to a sealing film for solar cell which mainly consists of ethylene-vinyl acetate copolymer and is used for a light receiving surface side of the solar cell. Furthermore, the present invention relates to a sealing film for a rear surface sealing film for a solar cell which mainly consists of ethylene-vinyl acetate copolymer.

2. Description of the Related Art

A solar cell has been paid attention as a device directly converting solar energy into electric energy from the viewpoints of effective use of natural resources and prevention of environment deterioration, and various solar cells have been developed.

In a solar cell, as described in FIG. 1, photovoltaic elements 4 made of silicon etc. are sealed by a light receiving surface sealing film 3A and a rear surface sealing film 3B made of EVA (ethylene-vinyl acetate copolymer) film between a glass plate as a transparent light receiving surface protection member 1 and a rear surface protection member 2 (backside covering material).

A solar cell is prepared by the following steps: the transparent light receiving surface protection member 1, the light receiving surface sealing film 3A, the photovoltaic elements 4, the rear surface sealing film 3B and the rear surface protection member 2 are superposed in this order and cross-linked the EVA by heating and pressing to unify the superposed product, thereby obtaining a solar cell.

When the solar cell is used under environment such as an outdoor environment in which the solar cell is exposed to high temperature and high humidity for a long period, water and moisture tend to permeate the solar cell. Conducting wires and electrodes of the solar cell are easily corroded with rust in the presence of the water and the moisture, resulting in reduction of a durability of the solar cell.

In order to improve the durability of the solar cell by preventing the conducting wires and the electrodes of the solar cell from corroding, the glass plate is used as the transparent light receiving surface protection member (see a patent document 1). However, even if the solar cell is sealed by using the glass plate, the durability of the solar cell cannot be sufficiently improved by preventing occurrence of rust.

In order to improve a photovoltaic performance of the solar cell, it is desired strongly to focus light to the photovoltaic elements by effectively collecting the light into the solar cell. From this viewpoint, it is preferred that the sealing film used for the solar cell has a high transparency, reflects and absorbs no incident light, and is capable of transmitting most of the light. For this reason, a colorless transparent EVA film having excellent water resistance is usually used as the sealing film for solar cell.

The EVA film is apt to generate acetic acid by the permeation of the water and the moisture at the high temperature with time, because the EVA comprises vinyl acetate as constituents. The acetic acid may accelerate the formation of rust by contacting with the wires and the electrodes of the solar cell. Therefore, in order to prevent highly the formation of rust of the solar cell, it is most effective to prevent the contact of the acetic acid with the conducting wires and the electrodes of the solar cell.

Document 2 discloses that a transparent EVA film which comprises an acid acceptor having an average particle diameter of not more than 5 μm in an amount of not more than 0.5% by weight is used as the sealing film for solar cell. The EVA film comprising the acid acceptor prevents the generation of the acid, thereby resulting in improvement the durability of the solar cell.

[patent document 1] JP-A-2000-174296
[patent document 2] JP-A-2005-29588

SUMMARY OF THE INVENTION

Problem to be Solved by the Invention

There has been considerable research on the solar cell. However, from a point of view of the widespread use of the solar cell, the solar cell is required to generate electric power for a long period under a sever native environment such as outdoor environment.

Accordingly, it is the object of the present invention to provide a sealing film for solar cell which enables the solar cell to generate high electric power over a longer period of time by preventing the conducting wires and the electrodes from rusting.

Means for Solving Problem

The present inventors has conducted extensive research to improve the durability of the solar cell, and consequently found out that the photovoltaic performance of the solar cell is occasionally reduced owing to the acid acceptor contained in the rear surface sealing film, when the solar cell provided with the sealing films containing the acid acceptors is used for a long period. Although the reason of the reduction of the durability is unclear, it is thought that ions generated from the acid acceptor affects the function of rear surface electrodes of the photovoltaic elements. In order to improve the durability of the solar cell, it is effective to prevent the reduction of the photovoltaic performance of the solar cell owing to the acid receptor.

In the first aspect of the present invention, it is found out that a sealing film for solar cell comprising the acid acceptor prevents effectively the corrosion of the metal to improve the durability of the solar cell by placing as a sealing film on the light receiving surface side of photovoltaic elements, thereby resulting in improvement of the durability of the solar cell.

In the first embodiment of the present invention, the problem can be resolved by the light receiving surface sealing film for solar cell comprising ethylene-vinyl acetate copolymer, a cross-linking agent and an acid acceptor.

In addition, in order to prevent the formation of rust of the solar cell, as described in Document 2, it is most effective to add the acid acceptor which traps acid such as acetic acid decomposing the metal to the sealing film. However, when the amount of the acid acceptor in the sealing film is increased to further prevent the formation of the rust, the photovoltaic performance of solar cell is apt to be reduced by reducing the transparency of the sealing film.

In the second aspect of the present invention, the present inventors have eagerly studied in view of aforementioned problems, and consequently found out that a sealing film for solar cell containing the acid acceptor at high concentrations prevents effectively the corrosion of the metal by placing on the opposite side of the light receiving surface of the photovoltaic elements, thereby resulting in improvement of the durability of the solar cell without the reduction of the photovoltaic performance.

In the second aspect of the present invention, the problem can be resolved by a rear surface sealing film for solar cell comprising ethylene-vinyl acetate copolymer, a cross-linking agent and an acid acceptor, wherein the amount of the acid receptor is not less than 0.5 parts by weight based on 100 parts by weight of ethylene-vinyl acetate copolymer.

Effect of the Invention

The light receiving surface sealing film for solar cell according to the first aspect of the present invention prevents the reduction of the photovoltaic performance caused by the acid acceptor and the corrosion of the metal of the solar cell caused by the acid such as acetic acid, thereby resulting in improvement of the durability of the solar cell. In particularly, the durability of the solar cell can be improved without the reduction of the photovoltaic performance by optimizing the particle size, the composition and the amount of the acid acceptor contained in the light receiving surface sealing film for solar cell.

The rear surface sealing film for solar cell according to the second embodiment of the present invention prevents the corrosion of the metal caused by the acid such as acetic acid generated by hydrolysis of the EVA film by optimizing the amount of the acid acceptor. The rear surface sealing film for solar cell, therefore, highly prevents the corrosion of the metals of the solar cell, so that maintain the excellent photovoltaic performance of the solar cell for a long period.

BRIEF DESCRIPTION OF THE DRAWINGS

FIG. 1 is a section view of a general solar cell.

DESCRIPTION OF THE REFERENCE NUMBERS

1: transparent light receiving surface protection member
2: rear surface protection member
3A: light receiving surface sealing film
3B: rear surface sealing film
4: photovoltaic elements

DETAILED DESCRIPTION OF THE INVENTION

[The First Light Receiving Surface Sealing Film for Solar Cell]

The light receiving surface sealing film for solar cell according to the first embodiment of the present invention is a film comprising ethylene-vinyl acetate copolymer, a cross-linking agent and an acid acceptor, and is placed on the light receiving surface of the photovoltaic elements. Specifically, the light receiving surface sealing film is used as the light receiving surface sealing film 3A shown in the above-mentioned FIG. 1.

The average particle diameter of the acid acceptor preferably is in the range of from 0.1 to 4.0 μm, more preferably from 0.1 to 0.9 μM, most preferably from 0.1 to 0.5 μm. The sealing film preferably has the high transparency (low HAZE, as measured according to JIS K 7136 (2000) is from 1.1 to 7.8%) in order to let a lot of light into the photovoltaic elements. In particularly, it is desired that the light receiving surface sealing film which is placed on the light receiving surface of the photovoltaic elements preferably has the excellent transparency. Accordingly, the light receiving surface sealing film comprising the acid acceptor with the above average particle diameter is effective in increasing the transparency of the sealing film to maintain the excellent photovoltaic performance of the solar cell from early period for a long period by, and ensuring the excellent acid acceptability of the acid acceptor.

The acid acceptor having the average particle diameter of not more than 4.0 μm has the excellent acid acceptability and can be highly dispersed to improve the transparency of the light receiving surface sealing film. In addition, the acid acceptor having the average particle diameter of not less than 0.1 μm prevents the agglomeration of it, so that the acid acceptor is highly dispersed in the light receiving surface sealing film.

The average particle diameter of the acid acceptor can be determined by observing at least 100 particles through an electronic microscope (preferably scanning electronic microscope) at 1,000,000-fold magnification, and calculating an average value of a diameter of a circle equivalent to projected area of individual particle.

There is no particular limitation on the composition of the acid acceptor, provided that the acid acceptor has a capability to absorb or neutralize acid such as acetic acid.

Examples of the acid acceptor include metal oxide, metal hydroxide, metal carbonate and combined metal hydroxide can be used. These acid acceptors can be selected depending on the amount of acetic acid and the use application. Examples of the acid acceptor include oxide, hydroxide, carbonate, carboxylate, sili-cate, borate, hypophosphite and metaborate of metal of 2 group of periodic table such as magnesium oxide, calcium oxide, magnesium hydroxide, calcium hydroxide, barium hydroxide, magnesium carbonate, barium carbonate, calcium carbonate, calcium borate, zinc stearate, phthalate calcium, calcium hypophosphite, zinc oxide, calcium silicate, magnesium silicate, magnesium borate, magnesium metaborate and calcium metaborate; oxide, basic carbonate, basic carbonate, basic hypophosphite and basic subsulfate of metal of 14 group of periodic table such as tin oxide, basic tin carbonate, tin stearate, basic tin phosphate, basic tin subsulfate, trilead tetraoxide, silicon oxide, silicon stearate; zinc oxide, aluminum oxide, aluminum hydroxide and iron hydroxide; and combined metal hydroxide such as hydrotalcite. These acid acceptors can be used singly, or in combination of two more kinds.

Examples of the magnesium oxide include STARMAG U, U-2, CX-150, M, M-2, L, P, C, CX, G and L-10 available from Konoshima Chemical Co., Ltd. In particular, STARMAG L is preferred. Examples of the hydrotalcite include $Mg_{4.3}Al_2(OH)_{12.6}CO_3 \cdot mH_2O$ (DHT-4A available from Kyowa Chemical Industry Co., Ltd.).

Of them, $Mg(OH)_2$ are preferred. $Mg(OH)_2$ highly prevents the conducting wires and the electrodes of the solar cell from rusting The amount of the acid acceptor of the light receiving surface sealing film is preferably in the range of from 0.01 to 0.15 parts by weight, more preferably from 0.01 to 0.12 parts by weight, in particularly from 0.01 to 0.1 parts by weight based on 100 parts by weight of ethylene-vinyl acetate copolymer contained in the light receiving surface sealing film. When the amount of the acid acceptor is more than 0.15 parts by weight, the transparency of the light receiving sealing film is apt to be reduced. When the amount of the acid acceptor is less than 0.01 parts by weight, the acid acceptability of the acid acceptor may not be enough.

The sealing film of the present invention comprises ethylene-vinyl acetate copolymer. Further, polyvinyl acetal resin (e.g., poly-vinyl formal, polyvinyl butyral (PVB), modified PVB) and/or polyvinyl chloride can be secondarily used. However, it is preferred to use only ethylene-vinyl acetate copolymer.

In the light receiving surface sealing film, the content of vinyl acetate recurring unit of ethylene-vinyl acetate copolymer preferably is in the range of 5 to 50 parts by weight, in particularly 10 to 40 parts by weight based on 100 parts by weight of ethylene-vinyl acetate copolymer. When the content of vinyl acetate recurring unit is less than 5 parts by weight, the transparency of the resin film is apt to be reduced after the cross-linking and curing stage at the high temperature. When the content of vinyl acetate recurring unit is more than 50 parts by weight, a generation of acetic acid is apt to be accelerated.

The thickness of the light receiving surface sealing film is generally in the range of 50 µm to 2 mm.

The light surface sealing film comprises a cross-linking agent in addition to the acid acceptor and ethylene-vinyl acetate copolymer. Preferred examples of the cross-linking agent include organic peroxide or photopolymerization initiator. Of them, the organic peroxide is preferred, because the sealing film having the improved adhesion, transparency, humidity resistance and penetration resistance can be prepared.

As the organic peroxide, any materials that can be decomposed at a temperature of not less than 100° C. to generate radical(s) can be employed. The organic peroxide is selected in the consideration of film-forming temperature, condition for preparing the composition, curing (bonding) temperature, heat resistance of body to be bonded, storage stability. Especially, preffered are those having a decomposition temperature of not less than 70° C. in a half-life of 10 hours.

From the viewpoint of resin processing temperature and storage stability, examples of the organic peroxides include benzoyl peroxide-type cure agent, tert-hexyl peroxypyvalate, tert-butyl peroxypyvalate, 3,5,5-trimethyl hexanoyl peroxide, di-n-octanoyl peroxide, lauroyl peroxide, stearoyl peroxide, 1,1,3,3-tetramethylbutylperoxy-2-ethyl hexanoate, succinic acid peroxide, 2,5-dimethyl-2,5-di(2-ethylhexanoylperoxy)hexane, 1-cyclohexyl-1-methylethylperoxy-2-ethyl hexanoate, tert-hexylperoxy-2-ethyl hexanoate, 4-methylbenzoyl peroxide, tert-butylperoxy-2-ethyl hexanoate, m-toluoyl benzoyl peroxide, benzoyl peroxide, 1,1-bis(tert-butylperoxy)-2-methylcyclohexanate, 1,1-bis(tert-hexylperoxy)-3,3,5-trimethylcyclohexanate, 1,1-bis(tert-hexylperoxy)cyclohexanate, 1,1-bis(tert-butylperoxy)-3,3,5-trimethylcyclohexanate, 1,1-bis(tert-butylperoxy)cyclohexanate, 2,2-bis(4,4-di-tert-butylperoxycyclohexyl)propane, 1,1-bis(tert-butylperoxy)cyclododecane, tert-hexylperoxyisopropyl monocarbonate, tert-butylperoxy maleic acid, tert-butylperoxy-3,3,5-trimethyl hexanoate, tert-butyl peroxylaurate, 2,5-dimethyl-2,5-di(methylbenzoylperoxy)hexane, tert-butylperoxyisopropyl monocarbonate, tert-butylperoxy-2-ethylhexyl monocarbonate, tert-hexyl peroxybenzoate and 2,5-di-methyl-2,5-di(benzoylperoxy)hexane As the benzoyl peroxide-type cure agents, any materials that can be decomposed at a temperature of not less than 70° C. to generate radical(s) can be employed. The benzoyl peroxide-type cure agent is selected in the consideration of film-forming temperature, condition for preparing the composition, curing (bonding) temperature, heat resistance of body to be bonded, storage stability. Examples of the benzoyl peroxide-type cure agents include benzoyl peroxide, 2,5-dimethyl-hexyl-2,5-bisperoxybenzoate, p-chlorobenzoyl peroxide, m-toluoyl peroxide, 2,4-dichlorobenzoyl peroxide, t-butyl peroxybenzoate and the like. The benzoyl peroxide-type cure agents can be each used singly, or in combination of two more kinds.

The amount of the organic peroxide in the light receiving surface sealing film preferably is in the range of 0.1 to 2 parts by weight, more preferably 0.2 to 1.5 parts by weight based on 100 parts by weight of ethylene-vinyl acetate copolymer. If the amount of the organic peroxide is low, the transparency of the sealing film is apt to be reduced. If the amount of the organic peroxide is excessive, the compatibility of the cross-linking agent with the copolymer is apt to be reduced.

As the photopolymerization initiator which can be used as the cross-linking agent, although any known materials can be employed, the photopolymerization initiator having the excellent storage stability after combining components is preferred. Examples of the photopolymerization initiator include acetophenone type such as 2-hydroxy-2-methyl-1-phenylpropane-1-one, and 1-hydroxycyclohexylphenylketone, 2-methyl-1-(4-(methylthio)phenyl)-2-morpholinopropane-1; benzoin type such as benzildimethylketal; benzophenon type such as benzophenon, 4-phenylbenzophenon and hydroxybenzophenon; thioxanthone type such as isopropylthioxanthone and 2,4-diethylthioxanthone; and other special initiator such as methylphenylglyoxylate. 2-hydroxy-2-methyl-1-phenylpropane-1-on, 1-hydroxycyclohexylphenylketone, 2-methyl-1-(4-(methylthio)phenyl)-2-morpholinopropane-1 and benzophenone are particularly preferred. These photopolymerization initiators can be used in combination with one or more photopolymerization promoters at an arbitrary ratio, if necessary. Examples of the photopolymerization promoter include benzoic acid type such as 4-dimethylamino benzoate and tertiary amine type. On the other hand, the only photopolymerization initiator can be each used singly, or in combination of two more kinds.

In the composition, the amount of the photopolymerization initiator is preferably from 0.5 to 5.0 parts by weight based on 100 parts by weight of ethylene-vinyl acetate copolymer.

The light receiving surface sealing film may contain various additives such as plasticizer, adhesion improver for improvement, cross-linking auxiliary agent such as acryloxy group-containing compound, methacryloxy group-containing compound and/or epoxy group-containing compound for improvement or adjustment of various properties of the film (e.g., mechanical strength, adhesive property (adhesion), optical characteristics such as transparency, heat resistance, light-resistance, cross-linking rate).

As the plasticizer, polybasic acid esters and polyhydric alcohol esters are generally employed, although the plasticizer can be used without any restriction. Examples of the esters include dioctyl phthalate, dihexyladipate, triethylene glycol-di-2-ethylbutylate, butyl sebacate, tetraethylene glycol heptanoate and triethylene glycol dipelargonate. The plasticizer can be used singly, or in combination of two or more kinds. The amount of the plasticizer is generally in an amount of not more than 5 parts by weight based on 100 parts by weight of EVA.

As the adhesion improver, a silane coupling agent can be used. Examples of the silane coupling agent include γ-chloropropylmethoxysilane, vinyltriethoxysilane, vinyl-tris(β-methoxyethoxy)silane, γ-methacryloxypropylmethoxysilane, vinyltriacetoxysilane, γ-glycidoxypropyltrimethoxysilane, γ-glycidoxypropyltriethoxysilane, β-(3,4-epoxycyclohexyl)ethyltrimethoxysilane, vinyltrichlorosilane, γ-mercaptopropylmethoxysilane, γ-aminopropyltriethoxysilane, and N-β-(aminoethyl)-γ-aminopropyltrimethoxysilane. The silane coupling agents can be used singly, or in combination of two or more kinds. The amount of the silane coupling agent is preferably in an amount of not more than 5 parts by weight based on 100 parts by weight of EVA.

Examples of the acryloxy group-containing compounds and methacryloxy group-containing compounds include generally derivatives of acrylic acid or methacrylic acid such as esters and amides of acrylic acid or methacrylic acid. Examples of the ester residue include linear alkyl group (e.g., methyl, ethyl, dodecyl, stearyl and lauryl), a cyclohexyl group, tetrahydrofurfuryl group, aminoethyl group, 2-hydroxyethyl group, 3-hydroxylpropyl group, 3-chloro-2-hydroxypropyl group. Example of the amide includes diacetone acryl amide. Further, the esters include esters of acrylic acid or methaacrylic acid with polyhydric alcohol such as ethylene glycol, triethylene glycol, polypolypropylene glycol, polyethylene glycol, trimethylol propane or pentaerythritol.

Examples of the epoxy group containing compounds include triglycidyl tris(2-hydroxyethyl)isocyanurate, neopentylglycol diglycidyl ether, 1,6-hexanediol diglycidyl ether, allyl glycidyl ether, 2-ethylhexyl glycidyl ether, phenyl glycidyl ether, phenol(ethyleneoxy)glycidyl ether, P-tert-butylphenyl glycidyl ether, diglycidyl adiapte, diglycidyl phthalate, glycidyl methacrylate and butyl glycidyl ether.

The acryloxy group-containing compound, the methacryloxy group-containing compound and the epoxy group-containing compound each are preferably in the range of from 0.5 to 5.0 parts by weight, especially 1.0 to 4.0 parts by weight based on 100 parts by weight of EVA.

In addition, the light receiving surface sealing film may comprise an ultraviolet absorbent, a photostabilizer and an antioxidant additionally.

Examples of the ultraviolet absorbents include benzophenone-type ultraviolet absorbents such as 2-hydroxy-4-methoxybenzophenone, 2-hydroxy-4-n-dodecyloxybenzophenone, 2,4-dihydroxybenzophenone, 2,2'-dihydroxy-4-methoxybenzophenone, and 2-hydroxy-4-n-octoxybenzophenone. The amount of the benzophenone-type ultraviolet absorbent preferably is in the range of 0.01 to 5 parts by weight based on 100 parts by weight of EVA.

A hindered amine photostabilizer can be used as the photostabilizer. Examples of the photostabilizers include LA-52, LA-57, LA-62, LA-63, LA-63p, LA-67 and LA-68 (all manufactured by ADEKA Co., Ltd.), TINUVIN® 744, TINUVIN® 770, TINUVIN® 765, TINUVIN® 144, TINUVIN° 622LD, and CHIMASSORB® 944LD (manufactured by Ciba Specialty Chemicals Co., Ltd.), and UV-3034 (manufactured by B.F. Goodrich). The photostabilizers can be each used singly, or in combination of two or more kinds. The amount of the photostabilizer preferably is in the range of 0.01 to 5 parts by weight based on 100 parts by weight of EVA.

Examples of the antioxidants include hindered phenol-type antioxidants such as N,N'-hexan-1,6-diyl-bis[3-(3,5-di-tert-butyl-4-hydroxyphenyl)propionamide], phosphorus-type heat stabilizers, lactone-type heat stabilizers, vitamin E-type heat stabilizers and sulfur-type heat stabilizers.

The formation of the light receiving surface sealing film can be carried out according to known processes by using a resin composition comprising ethylene-vinyl acetate copolymer, the acid acceptor, the cross-linking agent and if necessary other additives. The light receiving surface sealing film can be formed, for example, by forming the resin composition by using extrusion molding or calendaring. The heating temperature is generally in the range of from 50 to 90° C. so as not to decompose the cross-linking agent.

The light receiving surface sealing film of the present invention is used as a sealing film placed on the light receiving surface side of photovoltaic elements of the solar cell. The solar cell including the light receiving surface sealing film according to the present invention comprises a transparent light receiving surface protection member, a rear surface protection member and photovoltaic elements sealed therebetween by sealing films. The light receiving surface sealing film of the present invention is used as the sealing film placed between the transparent light receiving surface protection member and the photovoltaic elements. In addition, in this solar cell, the rear surface sealing film placed between the rear surface protection member and the photovoltaic elements dose not comprise the acid acceptor. Use of the light receiving surface sealing film which comprises the acid acceptor and the rear surface sealing film which does not comprise the acid acceptor in the solar cell enables the prevention of rusting conducting wires and electrodes and reducing the photovoltaic performance for a long period, thereby improving the durability of the solar cell.

In the present invention, the rear surface corresponds to the reverse side of the light receiving surface of the photovoltaic elements.

The solar cell is characterized in use of the above-mentioned sealing film placed on a light receiving surface. Therefore as materials used in components other than the sealing film (i.e., transparent light receiving surface protection member, the rear surface protection member and the photovoltaic elements), those used in a known solar cell can be used, which are not particularly restricted.

[The Second Rear Surface Sealing Film for Solar Cell]

The rear surface sealing film for solar cell according to the second embodiment of the present invention comprises ethylene-vinyl acetate copolymer, a cross-linking agent and an acid acceptor. The amount of the acid acceptor is not less than 0.5 parts by weight based on 100 parts by weight of ethylene-vinyl acetate copolymer. The rear surface sealing film is placed on the reverse side of the light receiving surface of the photovoltaic elements. Specifically, the rear surface sealing film is used as a rear surface sealing film 3B shown in the above-mentioned FIG. 1.

In order to prevent highly the formation of rust, it is preferred to increase the amount of the acid acceptor in the sealing film. However, the mere increase of the amount of the acid acceptor tends to cause the reduction of the transparency of the sealing film, thereby reducing the durability of the solar cell. Therefore, in the present invention, even if the transparency of the rear surface sealing film is reduced by adding the relatively large amount of acid acceptor to it, the amount of light entering the inside of the solar cell is sufficiently ensured by using the rear surface sealing film as a sealing film placed on the rear surface of the photovoltaic elements. The resistance to corrosion of the metal of the solar cell, therefore, is sufficiently ensured without strict restriction on using the acid acceptor such as type and amount of it.

The rear surface sealing film for solar cell comprises the acid receptor in the amount of not less than 0.5 parts by weight, preferably more than 0.5 parts by weight to not more than 5.0 parts by weight, in particularly more than 0.5 parts by weight to not more than 2.0 parts by weight based on 100 parts by weight of ethylene-vinyl acetate copolymer.

There is no particular limitation on the FIGURE of the acid receptor. The average particle diameter of the acid receptor is preferably in the range of from not more than 5.0 µm, more preferably from 1.0 to 4.0 µm, in particularly from 1.0 to 2.5 µm. The acid receptor particle having a large surface area has a large area of contact with acid, thereby highly preventing occurrence of rust of the conducting wires and the electrodes of the solar cell.

There is no particular limitation on the composition of the acid acceptor, provided that the acid acceptor has a capability to absorb or neutralize acid such as acetic acid. Specific examples of the acid acceptor are the same as the above-mentioned acid acceptor of the first light receiving surface sealing film for solar cell.

Preferred examples of the acid acceptor include magnesium hydroxide ($Mg(OH)_2$), magnesium oxide (MgO), zinc oxide (ZnO), trilead tetraoxide ($Pb_3O_4$), calcium hydroxide ($Ca(OH)_2$), aluminum hydroxide ($Al(OH)_3$), iron (II) hydroxide ($Fe(OH)_2$), calcium carbonate ($CaCO_3$) and hydrotalcite ($Mg_6Al_2(OH)_{16}CO_3$). In particularly, magnesium hydroxide ($Mg(OH)_2$), magnesium oxide (MgO) and zinc oxide (ZnO) are preferred.

The rear surface sealing film for solar cell of the present invention comprises ethylene-vinyl acetate copolymer. Further, polyvinyl acetal resin (e.g., poly-vinyl formal, polyvinyl butyral (PVB), modified PVB) and/or polyvinyl chloride can be secondarily used. However, it is preferred to use only ethylene-vinyl acetate copolymer.

The content of vinyl acetate recurring unit of ethylene-vinyl acetate copolymer preferably is in the range of 5 to 50 parts by weight, in particularly 10 to 40 parts by weight based on 100 parts by weight of ethylene-vinyl acetate copolymer. When the content of vinyl acetate recurring unit is less than 5 parts by weight, the transparency of the resin film is apt to be reduced after the cross-linking and curing stage at the high temperature. When the content of vinyl acetate recurring unit is more than 50 parts by weight, a generation of acetic acid is apt to be accelerated.

Examples of cross-linking agent which can be used for the rear surface sealing film include organic peroxide or photopolymerization initiator. Of them, the organic peroxide is preferred, because the sealing film having the improved adhesion, transparency, humidity resistance and penetration resistance can be prepared.

Specific examples of the organic peroxide and the photopolymerization initiator and the amount of these are the same as those in the first light receiving surface sealing film for solar cell, and therefore, omitted here.

The rear surface sealing film for solar cell preferably further comprises coloring agent. The lights falling from between the photovoltaic elements and passing through the photovoltaic elements can reenter the photovoltaic elements by reflecting the lights on the interface between the rear surface sealing film comprising the coloring agent and the lights receiving sealing film and by reflecting diffusely the lights by the coloring agent, thereby improving the photovoltaic performance of the solar cell.

Examples of the coloring agent include white coloring agent such as titan white and calcium carbonate; blue coloring agent such as ultramarine; black coloring agent such as carbon black; and lacteous coloring agent such as glass beads and light diffuser agent. White coloring agents such as titan white are preferred.

The coloring agent is preferably contained in the amount of from 2 to 10 parts by weight, more preferably from 3 to 6 parts by weight based on 100 parts by weight of ethylene-vinyl acetate copolymer comprised in the rear surface sealing film for solar cell.

The thickness of the rear surface sealing film for solar cell is generally in the range of 50 μm to 2 mm.

The rear surface sealing film may contain various additives such as plasticizer, adhesion improver for improvement, cross-linking auxiliary agent such as acryloxy group-containing compound, methacryloxy group-containing compound and/or epoxy group-containing compound for improvement or adjustment of various properties of the film (e.g., mechanical strength, adhesive property (adhesion), optical characteristics such as transparency, heat resistance, light-resistance, cross-linking rate). In addition, the rear surface sealing film may comprise an ultraviolet absorbent, a photostabilizer and an antioxidant additionally. Specific examples and amounts of those are the same as those of the first light receiving surface sealing film for solar cell, and therefore, omitted here.

The formation of the rear surface sealing film can be carried out according to known processes by using a resin composition comprising ethylene-vinyl acetate copolymer, the acid acceptor, the cross-linking agent and if necessary other additives. The rear surface sealing film can be formed, for example, by forming the resin composition by using extrusion molding or calendaring. The heating temperature is generally in the range of from 50 to 90° C. so as not to decompose the cross-linking agent.

The rear surface sealing film of the present invention is used as a sealing film placed on the reverse side of the light receiving surface side of photovoltaic elements of the solar cell. The solar cell including the rear surface sealing film according to the invention comprises a transparent light receiving surface protection member, a rear surface protection member and photovoltaic elements sealed therebetween by sealing films. The rear surface sealing film of the present invention is used as the sealing film placed between the rear surface protection member and the photovoltaic elements. Use of the rear surface sealing film which comprises a lot of the acid acceptor in the solar cell enables the prevention of the formation of rust of conducting wires and electrodes and the reduction of the photovoltaic performance for a long period, thereby improving the durability of the solar cell.

In the solar cell, the light receiving surface sealing film placed between the transparent light receiving surface protection member and the photovoltaic elements may comprise a small amount of the acid acceptor. The amount of the acid acceptor in the light receiving surface sealing film is preferably not more than 0.15 parts by weight, more preferably not more than 0.1 parts by weight, most preferably not more than 0.05 parts by weight based on the 100 parts by weight of ethylene-vinyl acetate copolymer. This optimization of the amounts of the acid acceptor in the rear surface sealing film and the light receiving surface sealing film prevents the corrosion of the metal of the solar cell without the reduction of the photovoltaic performance.

Examples of the acid acceptor which can be used for the light receiving surface sealing film are the same as the acid acceptor of the rear surface sealing film.

The solar cell is characterized in use of the above-mentioned sealing films placed on a light receiving surface and a rear surface. Therefore as materials used in components other than the sealing films (i.e., transparent light receiving surface protection member, the rear surface protection member and the photovoltaic elements), those used in a known solar cell can be used, which are not particularly restricted.

The solar cells using the first light receiving surface sealing film for solar cell or the second rear surface sealing film for solar cell can be prepared by sealing the photovoltaic elements between the transparent light receiving surface protection member and the rear surface protection member by using the sealing films comprising ethylene-vinyl acetate copolymer. The solar cells are prepared using the sealing film as shown in FIG. 1 so as to sufficiently seal the photovoltaic elements. In more detail, a transparent front side protection material 11, a front side sealing film 13A, photovoltaic elements 14, a backside sealing film 13B and backside protection material 12 are laminated. The laminated body may be heat-pressed by using vacuum laminator according to conventional methods, preferably under the conditions of temperature of 135 to 180° C., more preferably 140 to 180° C., in particularly 155 to 180° C., degassing time period of 0.1 to 5 minutes, pressure of press of 0.1 to 1.5 kg/cm$^2$, and pressing time period of 5 to 15 minutes. This heating enables the ethylene-vinyl acetate copolymer contained in the light receiving surface sealing film and the rear surface sealing film to crosslink, thereby combining the photovoltaic elements, the transparent light receiving surface protection member and the photovoltaic elements through the light receiving surface sealing film and the rear surface sealing film to seal the photovoltaic elements.

The glass plate of the present invention generally comprises silicate glass. The thickness of the glass plate is generally in the range of 0.1 to 10 mm, preferably 0.3 to 5 mm. The glass plate may be tempered in heat or chemical resistance.

The rear surface protection member is generally plastic film such as polyethylene terephthalate (PET). In the consideration of heat resistance, polyethylene fluoride film is preferred.

EXAMPLE

The present invention is illustrated in detail below using the following Examples. The invention is not restricted by the following Examples.

1. The Light Receiving Surface Sealing Film for Solar Cell According to the First Embodiment of the Present Invention Example 1A EVA (content of vinyl acetate based on 100 parts by weight of ethylene-vinyl acetate copolymer: 26 parts by weight) 100 parts by weight,
Cross-linking agent (2,5-dimethyl-2,5-di(t-butylperoxy) hexane) 1 parts by weight,
Cross-linking auxiliary (triallyl isocyanurate) 2 parts by weight,
Acid acceptor ($Mg(OH)_2$, average particle diameter of 0.4 µm) 0.05 parts by weight.

The EVA resin composition having the above-mentioned formulation was processed by mixing at 80° C. and calendaring process at 100° C. to prepare a sealing film (1A) having the thickness of 0.6 mm.

Comparative Example 1A

The procedures of Example 1A were repeated except for omitting use of the acid acceptor to prepare a sealing film (2A).

(Evaluation A)

The sealing films prepared as mentioned above and solar cells were evaluated by the following procedures.

1. Transparency of the Sealing Films

The HAZE (%) of the sealing films were measured according to JIS K 7136 (2000) using a turbidimeter (NDH 2000 type available from Nippon Denshoku Industries Co., Ltd.). The results were shown in Table 1.

2. All Light Beam Transmittances of the Sealing Films

All light beam transmittances of the sealing films in the thickness direction were determined at three points by using a turbidimeter (NDH 2000 type available from Nippon Denshoku Industries Co., Ltd.) and an average of the three measured values is calculated. The results were shown in Table 1.

3. Photovoltaic Performance of the Solar Cells

Solar cells were prepared by sealing the photovoltaic elements 4 composed of silicon between the transparent light receiving surface protection member 1 composed of a glass plate (thickness of 0.3 mm) and the rear surface protection member 2 composed of a polyethylene fluoride film (thickness of 50 µm) by using the sealing films (1A) and (2A) as the light receiving surface sealing film and the rear surface sealing film as shown in Table 2. The sealing was carried out by heating and pressing the laminated body with using vacuum laminator under vacuum at 150° C. to cross-rink EVA.

After that, the solar cells prepared as mentioned above were exposed to pseudo solar ray at the irradiation intensity of 1000 $mW/cm^2$, 25° C. by using a solar simulator (AM 1.5 spectrum). Subsequently, the open voltage [V], the nominal maximum power current [A] and the nominal maximum power voltage [V] per 1 $cm^2$ were measured and multiplied to determine the nominal maximum power [W] (JIS C8911 1998).

The solar cells were allowed to stand under environment of temperature of 121° C. and humidity of 100% RH for 240 hours. Then, the open voltage [V] and the nominal maximum power [W] were calculated as described above. The results were shown in Table 2.

TABLE 1

|  | Example 1A Sealing film (1A) | Comparative example 1A Sealing film (2A) |
| --- | --- | --- |
| EVA [parts by weight] | 100 | 100 |
| Cross-linking agent [parts by weight] | 1 | 1 |
| Cross-linking auxiliary [parts by weight] | 2 | 2 |
| $Mg(OH)_2$ [parts by weight] | 0.05 | 0 |
| Average particle diameter of $Mg(OH)_2$ [µm] | 0.4 | 0 |
| All light beam transmittances | 88.9 | 88.9 |
| HAZE | 1.9 | 0.8 |

TABLE 2

|  |  | Solar cell(1A) | Solar cell(2A) | Solar cell(3A) |
| --- | --- | --- | --- | --- |
| Sealing film | light receiving surface | (1A) | (1A) | (2A) |
|  | rear surface | (2A) | (1A) | (2A) |
| Open voltage | Before standing | 2.509 | 2.508 | 2.507 |
|  | After standing | 2.504 | 2.492 | 2.492 |
|  | Rate of change [%] | −0.20 | −0.64 | −0.60 |
| Nominal maximum power | Before standing | 9.67 | 9.62 | 9.82 |
|  | After standing | 9.28 | 9.43 | 8.35 |
|  | Rate of change [%] | −4 | −2 | −15 |

As shown in Table 2, the solar cell using the sealing film for solar cell of the present invention on the light receiving surface side of the photovoltaic elements prevents the reduction of the open voltage and the nominal maximum power. It is shown that the present invention provides the solar cell which has excellent durability and maintains the photovoltaic performance for a long period.

2. The Rear Surface Sealing Film for Solar Cell According to the Second Embodiment of the Present Invention

Example 1B

EVA (content of vinyl acetate based on 100 parts by weight of ethylene-vinyl acetate copolymer: 26 parts by weight) 100 parts by weight,
Cross-linking agent (2,5-dimethyl-2,5-di(t-butylperoxy) hexane) 1 parts by weight,
Cross-linking auxiliary (triallyl isocyanurate) 2.0 parts by weight,
Acid acceptor (Mg(OH)$_2$, average particle diameter of 3 µm) 0.5 parts by weight.

The EVA resin composition having the above-mentioned formulation was processed by mixing at 80° C. and calendaring process at 100° C. to prepare a sealing film (1B) having the thickness of 0.6 mm.

Comparative Example 1B and 2B

The procedures of Example 1B were repeated except for using the acid acceptor so as to have the formulations shown in the following Table 3 to prepare a sealing film (2B) and (3B).

(Evaluation B)

The sealing films prepared as mentioned above and solar cells were evaluated by the following procedures.

1. Amount of the Acetic Acid of the Sealing Films

The sealing films were immersed in 2 ml of acetone at 25° C. with stirring for 50 hours. Then, the amount [mg] of the acetic acid of the acetone extract was measured by using gaschromatograph. The results were shown in Table 3.

2. Photovoltaic Performance of the Solar Cell

Solar cells were prepared by sealing the photovoltaic elements 4 composed of silicon between the transparent light receiving surface protection member 1 composed of a glass plate (thickness of 0.3 mm) and the rear surface protection member 2 composed of a polyethylene fluoride film (thickness of 50 µm) by using the sealing films (1A)-(3A) as the light receiving surface sealing film and the rear surface sealing film as shown in Table 4. The sealing was carried out by heating and pressing the laminated body with using vacuum laminator under vacuum at 150° C. to cross-rink EVA.

After that, the solar cells prepared as mentioned above were exposed to pseudo solar ray at the irradiation intensity of 1000 mW/cm$^2$, 25° C. by using a solar simulator (AM 1.5 spectrum). Then, the open voltage [V], the nominal maximum power current [A] and the nominal maximum power voltage [V] per 1 cm$^2$ were measured and multiplied to calculate the nominal maximum power [W] (JIS C8911 1998).

The solar cells were allowed to stand under environment of temperature of 121° C. and humidity of 100% RH for 240 hours. Then, the open voltage [V] and the nominal maximum power [W] were calculated as described above. The results were shown in Table 4.

TABLE 3

|  | Example 1B Sealing film (1B) | Comparative example1B Sealing film (2B) | Comparative example 2B Sealing film (3B) |
|---|---|---|---|
| EVA [parts by weight] | 100 | 100 | 100 |
| Cross-linking agent [parts by weight] | 1 | 1 | 1 |
| Cross-linking auxiliary [parts by weight] | 2 | 2 | 2 |
| Acid acceptor [parts by weight] | 0.5 | 0.05 | 0 |
| Amount of acid acceptor [mg] | 120 | 400 | 860 |

TABLE 4

|  |  | Solar cell (1B) | Solar cell (2B) | Solar cell (3B) | Solar cell (4B) | Solar cell (5B) |
|---|---|---|---|---|---|---|
| Sealing film | light receiving surface | (3B) | (2B) | (3B) | (2B) | (3B) |
|  | rear surface | (1B) | (1B) | (2B) | (2B) | (3B) |
| Nominal maximum power | Before standing | 9.66 | 9.71 | 9.97 | 9.61 | 9.82 |
|  | After standing | 9.56 | 9.42 | 8.97 | 8.84 | 8.35 |
|  | Rate of change | −1% | −3% | −10% | −8% | −15% |

As shown in Table 4, the solar cell using the sealing film for solar cell of the present invention on the rear surface side of the photovoltaic elements prevents the reduction of the nominal maximum power and has improved durability.

INDUSTRIAL APPLICABILITY

The sealing films for solar cell according to the present invention provide the solar cell which can maintain the excellent photovoltaic performance for a long period.

The invention claimed is:

1. A light receiving surface sealing film for solar cell comprising ethylene-vinyl acetate copolymer, a cross-linking agent and an acid acceptor, wherein the acid acceptor is composed of Mg(OH)$_2$ and contained in the range of 0.01 to 0.15 parts by weight based on 100 parts by weight of ethylene-vinyl acetate copolymer, wherein the average particle diameter of the acid acceptor is in the range of from 0.1 to 4.0 µm, and wherein the haze of the light receiving surface sealing film, as measured according to JIS K 7136 (2000) is from 1.1-7.8%.

2. A light receiving surface sealing film for solar cell as defined in claim 1, wherein the average particle diameter of the acid acceptor is in the range of from 0.1 to 0.9 µm.

3. A light receiving surface sealing film for solar cell as defined in claim 1, wherein the content of vinyl acetate recurring unit of ethylene-vinyl acetate copolymer is in the range of from 5 to 50 parts by weight based on 100 parts by weight of ethylene-vinyl acetate copolymer.

* * * * *